United States Patent [19]

Downing et al.

[11] Patent Number: 4,890,727
[45] Date of Patent: Jan. 2, 1990

[54] METHOD AND APPARATUS FOR PLATING THROUGH HOLES IN GRAPHITE COMPOSITES

[75] Inventors: Ross O. Downing, Renton; David S. Banis, Seattle, both of Wash.

[73] Assignee: Osteo-Dyne, Inc., Charlotte, N.C.

[21] Appl. No.: 224,994

[22] Filed: Jul. 27, 1988

[51] Int. Cl.⁴ ............................................. C25D 17/00
[52] U.S. Cl. .............................................. 204/224 R
[58] Field of Search ........................... 204/224 R, 273

[56] References Cited

U.S. PATENT DOCUMENTS

| | | | |
|---|---|---|---|
| 1,739,657 | 12/1929 | Shemitz | 204/224 R |
| 3,763,027 | 10/1973 | Pearson | 204/224 R |
| 3,840,455 | 10/1974 | Cooley et al. | 204/269 |
| 4,010,005 | 3/1977 | Morisaki et al. | 204/16 |
| 4,033,844 | 7/1977 | Pantiga et al. | 204/224 R |
| 4,132,618 | 1/1979 | Boulanger et al. | 204/218 |
| 4,172,771 | 10/1979 | Grunke | 204/16 |
| 4,279,706 | 7/1981 | Blanc et al. | 204/26 |
| 4,280,884 | 7/1981 | Babb et al. | 204/109 |
| 4,294,680 | 10/1981 | Lincoln et al. | 204/224 R |
| 4,298,446 | 11/1981 | Ando et al. | 204/224 R |
| 4,348,267 | 9/1982 | Shimamura | 204/206 |
| 4,443,304 | 4/1984 | Eidschun | 204/27 |
| 4,554,062 | 11/1985 | Sergio | 204/206 |
| 4,560,460 | 12/1985 | Blasing et al. | 204/224 R |
| 4,572,768 | 2/1986 | Wolski et al. | 204/15 |
| 4,619,741 | 10/1986 | Minten et al. | 204/15 |
| 4,750,981 | 6/1988 | Dalland | 204/224 R |

Primary Examiner—T. M. Tufariello
Attorney, Agent, or Firm—Finnegan, Henderson, Farabow, Garrett & Dunner

[57] ABSTRACT

Improved method and apparatus are disclosed for through hole plating of composite materials. The apparatus of the present invention comprises a plating cell which includes a baffle plate intermediate a plating anode and the material to be plated. The baffle plate acts to distribute the plating material within the plating fluid to provide a resultant plated material of uniform thickness and adhesion. The plating cell also includes a plating fluid supply system which is remote from the plating cell to thereby allow the characteristics of the plating solution to be monitored and controlled. The method which comprises the present invention includes the step of co-curing the composite material with a plating foil prior to plating the material to provide improved adhesion of the plating material to the composite material.

22 Claims, 2 Drawing Sheets

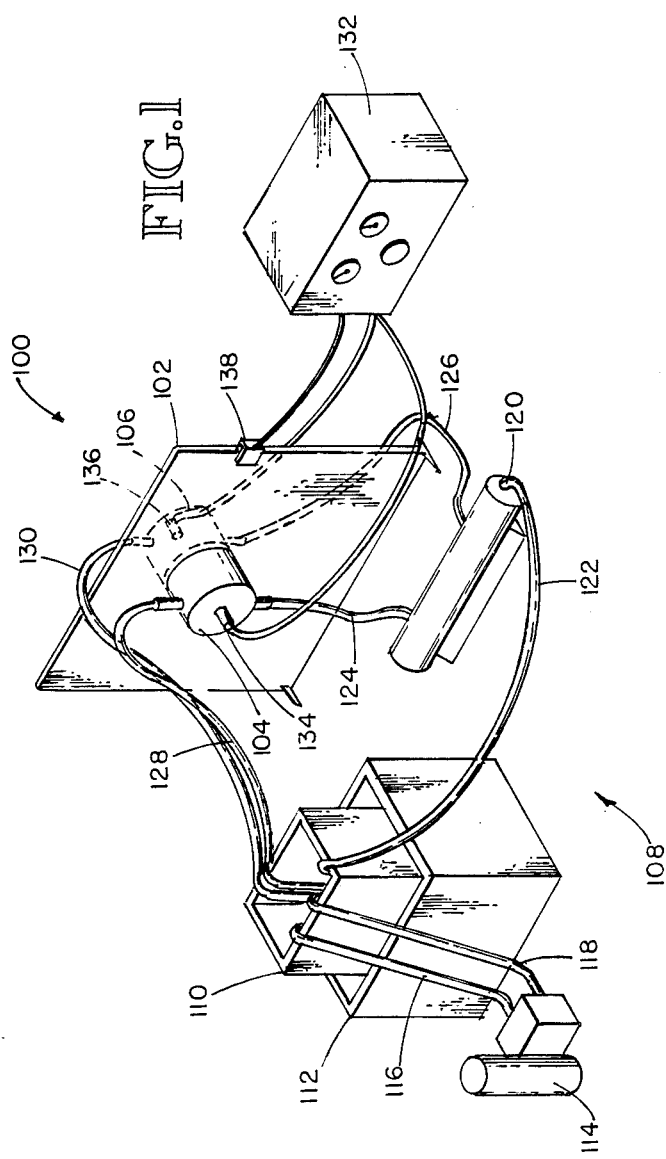

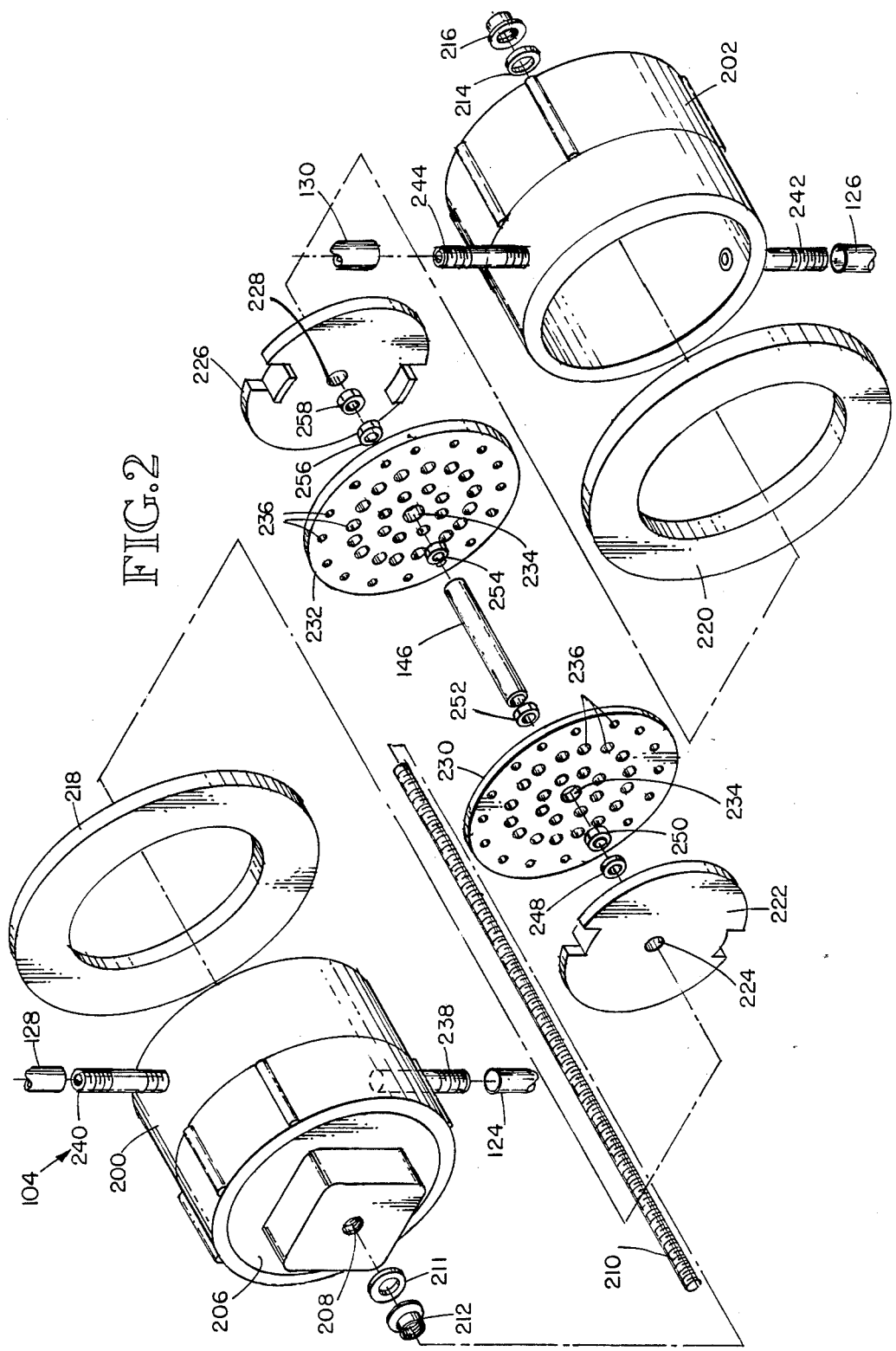

METHOD AND APPARATUS FOR PLATING THROUGH HOLES IN GRAPHITE COMPOSITES

STATEMENT OF GOVERNMENT INTEREST

The Government has certain rights in this invention.

DESCRIPTION

1. Technical Field

The present invention is directed toward through hole plating of materials and, more particularly, is directed toward an improved method and apparatus for through hole plating of composite materials.

2. Background of the Invention

Metal plating of semiconductive materials has been used for several years to provide a surface conductivity path across the nonconductor. For many applications, the resulting characteristics of the surface-plated semiconductor are not critical and, therefore, a variety of plating techniques may be employed. However, in some applications, the characteristics of the resultant surface-plated semiconductor are critical to the performance of the surface-plated device. As an example, the aircraft industry uses through hole plating of graphite composites to improve the lightning strike characteristics of the outer shell of an aircraft. In this application, it is essential that the surface-plated composite have smooth, uniform plating with uniform adhesion both inside and outside the through hole. It is further essential that the plated material have a minimum of defects as is known in the industry.

Many prior art methods for plating semiconductive materials employ a plating bath wherein the semiconductive material is negatively charged and a source of plating material is positively charged such that the plating material is attached to the semiconductor and adheres thereto. While these methods are sufficient for plating materials wherein the characteristics of the resultant surface-plated material is noncritical, these methods are not sufficient for applications wherein the surface characteristics must be controlled within desired specifications, e.g., the aircraft industry. More particularly, plating using the plating bath method results in surface plating of nonuniform thickness or adhesion because the plated material tends to accumulate at the edges of the semiconductor and is therefore thicker at the edges and adheres better to the edges. Conversely, the plating is thinner on the material's surface and does not adhere as well to the surface. The nonuniformity of thickness and adhesion at the surface results in failure of the plating during high current conduction periods, e.g., a lightning strike. Accordingly, the bath plating method is not acceptable for aircraft applications. Further, this method results in surface defects of the resultant plated material, which defects lead to current arcing and resultant failure. For this added reason, the bath plating method is not acceptable for aircraft and other critical applications.

It is therefore desirable to provide method and apparatus for plating through holes in semiconductive materials, which method and apparatus results in a plated through hole that meets critical design specifications. It is further desirable to provide method and apparatus for plating semiconductive materials which method allows for ready monitoring and control of the plating fluid. It is also desirable to provide portable apparatus for plating materials which can be used "on-site" of an aircraft construction location.

SUMMARY OF THE INVENTION

The present invention comprises method and apparatus for plating semiconductive material such that the characteristics of the resultant surface-plated material can be controlled to within critical design characteristics. The apparatus comprises a plating cell for housing the plating operation wherein the cell is sealably mountable to the material to be plated. A fluid supply system is provided for supplying a plating fluid to the plating cell. A source of plating material is adapted to be dissolved in the plating fluid. A baffle is positioned within the plating cell for agitating the plating fluid within the cell. A source of electric power is provided for positively energizing the plating fluid and negatively energizing the material to be plated such that the material is surface-plated with a composition consisting of a portion of the plating source material.

In a first alternative embodiment of the invention, the baffle includes a plurality of apertures which provide a fluid flow path from the electric power source to the material to be plated. The baffle aids in distributing the current, and hence the plating source material, within the plating fluid to result in a more uniform surface-plated material. Further, the baffle agitates the plating fluid to provide a turbulent fluid flow proximate the material to be plated, thereby reducing surface defects on the resultant plated surface.

In another alternative embodiment of the invention, the fluid supply system includes a reservoir for storing the plating fluid, a control system associated with the reservoir for controlling selected characteristics of the plating fluid and a fluid pump for delivering the plating fluid to the plating cell. The control system may be adapted to monitor and control the purity of the plating fluid, the temperature of the plating fluid and/or the chemical composition of the plating fluid.

In accordance with the method for plating materials which comprises the subject invention, a plating fluid is provided to a plating zone proximate the material to be plated. An electrical power source is provided to an anode zone remote from the material to be plated. The flow of fluid between the plating zone and the anode zone is restricted to improve the current distribution, and hence, the distribution of the plating material within the plating fluid, and thereby improve the resultant characteristics of the surface-plated material. In an alternative embodiment of the foregoing method, wherein the material to be plated comprises a composite material, the method further includes the step of co-curing the composite material with a plating foil prior to performing the plating steps described above.

BRIEF DESCRIPTION OF THE DRAWINGS

FIG. 1 is a schematic illustration of apparatus for plating semiconductive materials which comprises the present invention.

FIG. 2 is an exploded illustration of the plating cell illustrated in FIG. 1.

DETAILED DESCRIPTION OF THE DRAWING

The apparatus which is the subject of the present invention for plating composite materials is illustrated in FIG. 1. Therein, a plating cell 100 is sealably coupled to a composite panel 102 for plating a through hole located in the composite panel 102. The plating cell comprises a major body portion 104 and an opposing body portion 106 each being mounted to opposite sides of the composite panel 102 via the through hole, as will be described more fully below.

The plating apparatus further comprises a fluid supply system 108 for supplying a plating fluid to the plating cell 100. As is known in the art, a plurality of fluids can be used as a transport medium during the surface-plating operation. In the presently preferred embodiment of the invention, the plating solution is preferably an electrolyte solution for which agitation during plating is desirable. Copper sulfate/sulfuric acid has been identified as one plating solution which is suitable for use with the subject plating apparatus.

The fluid supply system 108 comprises a reservoir 110 for storing the plating solution. The reservoir 110 may comprise any apparatus, open or closed, for containing the plating solution. A particular advantage of the present invention is that the characteristics of the plating solution may be monitored by a user and thereby controlled and maintained within desired plating specifications. As an example, the reservoir 110 is disposed within a water bath 112 to thereby maintain the temperature of the plating solution within desired plating specifications. It will be apparent to those skilled in the art that the water bath 112 may include temperature control apparatus, such as, for example, a temperature sensor and means for altering the bath temperature, to further control the temperature of the plating solution.

Further, use of the reservoir 110 allows for filtering the plating fluid to maintain its purity within desired plating specifications. To this end, a filter pump 114 is provided and adapted to circulate plating fluid from the reservoir 110 via inlet and outlet fluid tubes 110 and 118, respectively. The filter pump 114 may comprise any suitable pump and filter combination for controlling the chemical composition of the plating solution.

It will be apparent to those skilled in the art that although the present invention is described by reference to apparatus for controlling the temperature and purity of the plating solution, other characteristics of the plating solution may be likewise controlled, e.g., the chemical composition of the plating solution, the metal level of the plating solution, the pH of the plating solution, etc. Further, it will be apparent to those skilled in the art that automated means can be combined with the subject plating apparatus to automatically control these characteristics of the plating solution.

The plating solution is provided to the plating cell 100 from the reservoir 110 by a solution pump 120. The solution pump 120 is constructed to draw the plating fluid from the reservoir 110 via a pump inlet to 122. The plating solution is provided to the plating cell 100 via first and second cell inlet tubes 124 and 126. It is to be noted that the first cell inlet tube 124 supplies the plating solution to the major body portion 104 of the plating cell 100 and the second cell inlet tube 126 supplies the plating solution to the opposing body portion 106 of the plating cell 100. As will be described below, it is a particular feature of the invention that the plating solution is independently supplied to the major body portion 104 and the opposing body portion 106 of the plating cell 100. It will, however, be apparent to those skilled in the art that the subject invention could be implemented with a single cell inlet for supplying the plating solution to either the major body portion 104 or the opposing body portion 106 of the plating cell 100.

The plating solution is withdrawn from the plating cell 100 via first and second cell outlet tubes 128 and 130, respectively. Again, it is to be noted that the first cell outlet tube 128 withdraws the plating solution from the major body portion 104 of the plating cell and the second cell outlet tube 130 withdraws the plating solution from the opposing body portion 106. Again, it will be appreciated by those skilled in the art that a single cell outlet tube could be provided for withdrawing the plating solution from either the major body portion 104 or the opposing body portion 106 of the plating cell 100.

Another particular feature of the subject invention is that the plating solution is supplied to the bottom of the plating cell 100 and withdrawn from the top of the plating cell 100. In this manner, bubbles which may form within the plating cell will rise to the top of the cell and be withdrawn with the moving fluid. Accordingly, the resultant surface-plated material is relatively free of defects which may result from the formation and entrapment of bubbles within the plating cell 100.

An electrical power source 132 is provided and coupled to the plating cell 100 and the composite panel 102. A first positive anode 134 of the power source 132 is coupled to the major body portion 104 of the plating cell 100 and a second positive anode 136 is coupled to the opposing body portion 106, as will be described more fully below. A negative electrode 138 is coupled to the composite panel 102. As is known in the art, current supplied by the electrical power source 132 combines with the plating solution to electrically energize a metal-plating source material in the plating solution such that the source material is conducted with the current to the negative cathode 138, e.g., the through hole of the composite panel 102 whereat the plating is to occur. Particular inventive features of the plating cell 100 act to distribute the current within the plating solution and thereby distribute the plating source material to provide a more uniform resultant surface-plated semiconductor. With reference to the exploded diagram of the plating cell 100 illustrated in FIG. 2, a more detailed description of the plating cell will be provided.

As shown in FIG. 2, the major and opposing body portions 104 and 106 each comprise hollow cylinders 200 and 202, respectively. An end cap 204 is sealably mounted to the hollow cylinder 200 to provide a cup-like housing structure for the major body portion 104. Similarly, an end cap (not shown) is sealably mounted to the hollow cylinder 202 to provide a cup-like housing structure for the opposing body portion 106.

The end cap 206 includes an aperture 208 which is adapted to receive a conducting rod 210. The conducting rod 210 performs the dual functions of: (1) providing structural support to the mounted plating cell 100 to secure the major body portion 104 and the opposing body portion 106 to the composite panel 102, and; (2) providing a path of electrical conductivity between the first and second anodes 134 and 138 and the plating source material, as will be described more fully below. The conducting rod is sealably mounted to the end cap 206 of the major body portion 104 via a washer 211 and a nut 212. In similar fashion, the conducting rod 210 is sealably mounted to the opposing body portion 106 via a washer 214 and a nut 216. It will be noted that the first and second positive anodes 134 and 138 of FIG. 1 may be coupled either to the conducting rod 210 or, alternatively, to the nut 212 and 216. It is, however, desirable that current supplied by the electrical power source 132 be conducted to both ends of the conducting rod 210 as illustrated in FIG. 1. It will also be noted that seal could be provided intermediate the washers 211, 214 and the end caps to seal the conducting rod 210 to the plating cell 100 when necessary or desired.

Those skilled in the art will appreciate that the conducting rod 210 extends through the through hole (not shown) of the composite panel 102 to mount the major body portion 104 and the opposing body portion 106 to the composite panel 102. In the presently preferred embodiment, the conducting rod 210 is sized to allow fluid flow from the major body portion 104 to the opposing body portion 106, and vice versa, to ensure plating to the composite panel 102 within the through hole.

The major body portion 104 of the plating cell 100 further includes a ring seal 218 for sealably mounting the major body portion 104 to the composite panel 102. The ring seal is placed intermediate the hollow cylinder 200 and the composite panel 102 and is clamped thereto via the conducting rod 210 and the nuts 212 and 216 to provide a sealed, plating compartment within the major body portion 104 of the plating cell 100. In similar fashion, a ring seal 220 is associated with the opposing body portion 106 of the plating cell 100 to sealably mount the opposing body portion 106 to the composite panel 102.

The ring seals 218 and 220 may comprise any apparatus for sealably mounting the plating cell 100 to the composite panel 102. In the presently preferred embodiment of the invention, the ring seals 218 and 220 each comprise rubber neoprene seals with an embedded aluminum ring. The embedded aluminum ring provides strength and rigidity to the mounted plating cell 100 thereby enhancing the seal provided between the plating cell and the composite panel 102.

In the presently preferred embodiment of the invention, the plating source material comprises an anode 222 which includes an aperture 224 for receiving the conducting rod 210. The anode 222 is adapted to be in electrical contact with the conducting rod 210 to receive current supplied by the electrical power source 132. The aperture 224 of the anode 222 is adapted to be threadably mounted to the conducting rod 210 to ensure adequate electrical conduction therebetween. However, the anode 222 may be electrically coupled to the conducting rod 210 by any means known in the art. Further, it will be apparent to those skilled in the art that although the electrical power source 132 is coupled to the anode 222 via the conducting rod 210 in the presently preferred embodiment, the electrical power source 132 may be coupled to the anode 222 in a variety of ways.

Like the major body portion 104, the opposing body portion 106 includes an anode 226 having an aperture 228 which is adapted to be threadably mounted to the conducting rod 210. The anodes 222 and 226 comprise the source of plating material such that the plating material is dissolved in the plating fluid within the plating cell. However, alternate methods of dissolving the plating source material within the plating fluid will readily become apparent to those skilled in the art. As an example, anodes 222 and 226 may comprise noncorrosive material which do not dissolve in the plating fluid and the plating source material may be dissolved in the plating fluid in or about the reservoir 110 illustrated in FIG. 1.

First and second baffles 230 and 232 are provided and associated with the major body portion 104 and the opposing body portion 106, respectively, of the plating cell 100. Each baffle includes a central aperture 234 which is sized to receive the conducting rod 210. The baffles 230 and 232 further include a plurality of fluid flow apertures 236 for providing a fluid flow path from the anode to the composite panel 102.

In operation, the anode 222 and baffle 230 are mounted to the conducting rod 210 and positioned within the hollow cylinder 200 of the major portion 104. The ring seal 218 is placed on a first side of the composite panel 102 and the major body portion 104 of the plating cell 100 is mounted to the first side of the composite panel by inserting the conducting rod 210 through the through hole of the composite panel 102. The baffle 222 and the anode 226 are mounted to the conducting rod 210 and positioned within the hollow cylinder 202 of the opposing body portion 106 with the ring seal 220 positioned intermediate the opposing body portion and the composite panel 102 on a second side of the composite panel 102. The plating cell 100 is then sealably mounted to the composite panel 102 by tightening the nuts 212 and 216.

When mounted, a first plating chamber is defined intermediate the baffle 230 and the composite panel 102 and a second plating chamber is defined intermediate the composite panel 102 and the baffle 232. Similarly, a first anode chamber is defined intermediate the end cap 206 and the baffle 230 and a second anode chamber is defined intermediate the baffle 232 and the end cap (not shown) of the opposing body portion 106.

The major body portion 104 of the plating cell 100 includes an inlet port 238 adapted to be coupled to the first cell inlet tube 124 to receive the plating solution. An outlet port 240 is adapted to be coupled to the first cell outlet tube 128 to discharge the plating solution from the major body portion 104. Similarly, the opposing body portion 106 includes an inlet port 242 and an outlet port 244 adapted to be coupled to the second cell inlet tube 126 and the second cell outlet tube 130, respectively. The inlet/outlet ports 238–244 may be coupled to the inlet/ outlet tubes 124–130 by any means known in the art.

In the presently preferred embodiment, the inlet and outlet ports 238 through 244 of the plating cell 100 are mounted to the body portions 104 and 106 at a point proximate the end of the hollow cylinder which is to be mounted to the composite panel 102. More particularly, it is desirable that the plating solution be provided to the plating chambers, i.e., the chambers intermediate the baffles 230 and 232 and the composite panel 102, of the plating cell 100. In this manner, the baffles 230 and 232 act to agitate the plating solution within the plating chambers while minimizing agitation of the plating solution within the anode chamber. Selective agitation of the plating solution results in improved plating characteristics, e.g., by: (1) minimizing transport of sludge from the anode chamber to the plating chamber, and; (2) removing sludge from the plating chamber by way of the agitated plating solution.

Further, the fluid flow apertures 236 of the first and second baffles 230 and 232 act to uniformly distribute current supplied to the plating chambers from the electrical power source 132 via the anode chambers within the plating solution. Accordingly, the plating material provided from anodes 224 and 226 are likewise more uniformly distributed in the plating fluid resulting in a more uniform surface-plated composite panel 102.

To further increase the uniformity of the through hole plating, a plastic shield 246 is provided and adapted to be mounted to the conducting rod 210 intermediate the baffles 230 and 232. The plastic shield 246 prevents discharge of current within the plating chambers to thereby limit the current within the plating chambers to the uniformly distributed current provided from the anode chambers.

Nuts 248–258 may be provided to secure the anodes 222, 226 and the baffles 230, 232 in place while positioned within the plating cell 100.

The hollow cylinders and end caps of the major and opposing body portions 104 and 106 comprise nonmetal material, preferably plastic. Similarly, baffles 230 and 232 comprise nonmetal material which likewise may be plastic. The anodes 222 and 226 comprise copper anodes for providing a copper source to the plating chambers resulting in a copper-plated composite panel 102. The conducting rod 210 may comprise any electrical conductor and preferably one which is corrosion-resistant. In the presently preferred embodiment, the conducting rod 210 comprises a titanium rod.

In accordance with the method of plating the composite panel 102, which also comprises a portion of the present invention, the composite panel 102 is co-cured with a plating foil prior to the plating operation. Preferably, the composite material is co-cured with the plating foil in the vicinity of the through hole before the through hole is bored in the composite panel 102. Also, the plating foil is preferably of a material which is similar to the plating source material of the first and second anode 222 and 226. Co-curing the composite material with a plating foil prior to the plating step results in greater adhesion between the plated material and the composite material.

Further, it is desirable to orient the composite panel 102 vertically, as shown in FIG. 2. This results in decreased pitting in the resultant plated semiconductor.

Although the invention has been illustrated and described herein by reference to several presently preferred embodiments thereof, it will be apparent to those skilled in the art that many modifications and variations of the present invention may be made without departing from the true scope and spirit of the invention. Accordingly, the invention should not be limited to the several embodiments shown and described above but should only be limited by the appended claims which follow.

We claim

1. Apparatus for plating materials, comprising:
a plating cell having first and second halves, each said half including a hollow cylinder and an end cap sealably attachable to a first end of said cylinder and having an aperture therethrough, said plating cell further including first and second ring seals for sealably mounting said first and second cylinders to the material to be plated;
an elongate, electrically conducting rod sized to fit the aperture of each said end cap and sealably mountable thereto;
first and second disk shaped anodes, each said anode being sized to fit within said cylinder of a respective one of said cell halves and including an aperture sized to receive said rod, said rod being electrically coupleable to said first and second anodes;
first and second disk shaped baffles each including an aperture sized to receive said rod, said first and second baffles being respectively positionable within said cylinder of said first and second plating cell halves to define first and second plating chambers between the material and said first and second baffles, respectively, and to define respective first and second anode chambers between said first and second baffles and said first and second end caps, respectively, each said first and second baffle further including at least one flow aperture providing a fluid flow path from its respective anode chamber to its plating chamber;
electric power means for providing electrical power to said rod and the material to be plated; and
fluid supply means for supplying a plating fluid to said plating cell.

2. Apparatus as recited in claim 1 wherein said fluid supply means comprises:
a reservoir for storing the plating fluid;
control means associated with said reservoir for controlling selected characteristics of the plating fluid;
pump means for delivering the plating fluid to said plating cell; and
inlet/outlet (I/O) means for delivering the plating fluid into the first and second plating chambers and extracting the plating fluid from the first and second plating chambers.

3. Apparatus as recited in claim 2 wherein said control means comprises means for monitoring the purity of the plating fluid.

4. Apparatus as recited in claim 2 wherein said control means comprises means for monitoring the temperature of the plating fluid.

5. Apparatus as recited in claim 2 whereins aid control means comprises means for monitoring the chemical composition of the plating fluid.

6. Apparatus as recited in claim 2 wherein said inlet/outlet means comprises means for delivering the plating fluid to the bottom of said plating cell and for extracting the plating fluid from the top of said cell.

7. Apparatus as recited in claim 1, further comprising a hollow cylindrical insulator sized to receive said rod and to be positionable intermediate said first and second baffles.

8. Apparatus for plating materials, comprising:
cell means for housing the plating operation, said cell means being sealably mountable to the material to be plated;
fluid supply means for supplying a plating fluid to said cell means said fluid supply means being positioned proximate the material to be plated;
plating source means for providing the plating material in the plating fluid;
baffle means, said baffle means being positioned intermediate said plating source means and said fluid supply means for limiting fluid flow from said plating source means to the material to be plated, said baffle means cooperating with said fluid supply means for providing substantially turbulent fluid flow in the vicinity of the material to be plated; and
electric power means for providing electrical power to said plating fluid and the material to be plated.

9. Apparatus as recited in claim 8 wherein said baffle means comprises a baffle including a plurality of apertures which provide a fluid flow path from said plating source means to the material to be plated.

10. Apparatus as recited in claim 9 wherein said fluid supply means comprises:
a reservoir for storing the plating fluid;
control means associated with said reservoir for controlling selected characteristics of the plating fluid; and
pump means for delivering the plating fluid to said cell means.

11. Apparatus as recited in claim 10 wherein said control means comprises means for monitoring the purity of the plating fluid.

12. Apparatus as recited in claim 10 wherein said control means comprises means for monitoring the temperature of the plating fluid.

13. Apparatus as recited in claim 10 wherein said control means comprises means for monitoring the chemical composition of the plating fluid.

14. Apparatus as recited in claim 10 wherein said fluid supply means further comprises means for delivering the plating fluid to the bottom of said cell means and for extracting the plating fluid from the top of said cell means.

15. Apparatus as recited in claim 8 wherein said cell means comprises a hollow, cylindrical major body portion, an end cap mounted to a first end of said major body portion and a ring seal for sealably mounting said major body portion to the material to be plated.

16. Apparatus as recited in claim 15 wherein said cell means further comprises an elongate, electrically conducting rod, said end cap including an aperture sized to receive said rod, said cell means also including fastener means mountable to both ends of said rod for fixedly securing said cell means to the material to be plated.

17. Apparatus as recited in claim 10 wherein said cell means comprises a hollow cylindrical major body portion, an end cap mounted to a first end of said major body portion and a ring seal for sealably mounting said major body portion to the material to be plated.

18. Apparatus as recited in claim 17 wherein said cell means further comprises an elongate, electrically conducting rod, said end cap including an aperture sized to receive said rod, said cell means also including fastener means mountable to both ends of said rod for fixedly securing said cell means to the material to be plated.

19. Apparatus as recited in claim 15 wherein said cell means further comprises a hollow, cylindrical opposing body portion, an opposing end cap mounted to a first end of said opposing body portion and an opposing ring seal for sealably mounting said opposing body portion to the material to be plated, said opposing body portion being mounted on a side of the material to be plated opposite said major body portion.

20. Apparatus as recited in claim 19 wherein said fluid supply means comprises means for supplying the plating fluid to said major body portion and means for supplying the plating fluid to said opposing body portion such that the plating fluid is supplied to both sides of the material to be plated.

21. Apparatus as recited in claim 17 wherein said cell means further comprises a hollow, cylindrical opposing body portion, an opposing end cap mounted to a first end of said opposing body portion and an opposing ring seal for sealably mounting said opposing body portion to the material to be plated, said opposing body portion being mounted on a side of the material to be plated opposite said major body portion.

22. Apparatus as recited in claim 21 wherein said fluid supply means comprises means for supplying the plating fluid to said major body portion and means for supplying the plating fluid to said opposing body portion such that the plating fluid is supplied to both sides of the material to be plated.

* * * * *

UNITED STATES PATENT AND TRADEMARK OFFICE
CERTIFICATE OF CORRECTION

PATENT NO.   :   4,890,727

DATED        :   January 2, 1990

INVENTOR(S)  :   Ross O. Downing et al.

It is certified that error appears in the above-identified patent and that said Letters Patent is hereby corrected as shown below:

On the cover page, delete "Assignee: Osteo-Dyne, Inc., Charlotte, N.C." and substitute therefor --Assignee: The Boeing Company, Seattle, Washington--.

On the cover page, delete "Attorney, Agent, or Firm-Finnegan, Henderson, Farabow, Garrett & Dunner" and substitute --Attorney, Agent, or Firm: Seed & Berry--.

Signed and Sealed this

Fourth Day of June, 1991

*Attest:*

HARRY F. MANBECK, JR.

*Attesting Officer*  *Commissioner of Patents and Trademarks*